United States Statutory Invention Registration [19]

[11] Reg. Number: H487

Clark et al. [43] Published: Jul. 5, 1988

[54] DIRECT CABLE ATTACH METHOD

[75] Inventors: Barbara L. Clark, Waltham, Mass.; Wayne D. Kuipers, Newport Beach, Calif.

[73] Assignee: The United States of America as represented by the Secretary of the Air Force, Washington, D.C.

[21] Appl. No.: 885,116

[22] Filed: Jul. 14, 1986

[51] Int. Cl.[4] ..... H01R 9/06; H05K 3/00

[52] U.S. Cl. ..... 29/843; 29/860; 29/858

[58] Field of Search ..... 29/831, 842, 843, 857, 29/860, 621, 858

[56] References Cited

U.S. PATENT DOCUMENTS

| | | | |
|---|---|---|---|
| 3,444,347 | 5/1969 | Mulcahy | 219/85 |
| 3,751,801 | 8/1973 | Praeger et al. | 29/628 |
| 3,795,047 | 3/1974 | Abolafia et al. | 29/843 |
| 4,091,529 | 5/1978 | Zaleckas | 29/628 |
| 4,171,477 | 10/1979 | Funari | 219/56.21 |
| 4,337,573 | 7/1982 | Nicolas et al. | 29/831 |
| 4,342,152 | 8/1982 | Taylor | 29/860 |

*Primary Examiner*—Charles T. Jordan
*Assistant Examiner*—Michael J. Carone
*Attorney, Agent, or Firm*—William Stepanishen; Donald J. Singer

[57] ABSTRACT

A direct cable attachment method for directly connecting a flat ribbon cable to a stack of integrated circuit units by pre-tinning the leads of both the ribbon cable and the wiring board with solder. Positioning the ribbon cable on the wiring board and applying sufficient heat to the combination to achieve a physical and electrical connection. Adding epoxy to the assembly structure provides additional strength.

6 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DIRECT CABLE ATTACH METHOD

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a cable attachment technique, and in particular to a direct cable attachment method for attaching ribbon cable directly to either a single chip or a stack of integrated circuit chips.

In the prior art, there are many electronic circuit applications that require multiple connections to either a single integrated circuit unit or a plurality of IC units that are arranged in a stack. An example of such a stack of IC units may be photo-detector array module which is comprised of a stack of semiconductor chips having integrated circuitry on each chip. Presently, it is common practice to connect the electronic circuitry on the back plane of such an IC unit to the balance of the external electronics that would be necessary to provide the operation for the photo-detecting application, by means of a ribbon cable.

Exemplary in the art of attaching cables and leads to circuit boards and integrated circuit chips are the following U.S. patents, which are incorporated herein by reference:

U.S. Pat. No. 3,444,347 issued to Mulcahy on May 13, 1969;

U.S. Pat. No 3,751,801 issued to Praeger et al on Aug. 14, 1973;

U.S. Pat. No. 4,091,529 issued to Zaleckas on May 30, 1978;

U.S. Pat. No. 4,171,477 issued to Funari on Oct. 16, 1979;

U.S. Pat. No. 4,337,573 issued to Nicholas et al on July 6, 1982;

U.S. Pat. No. 4,342,152 issued to Taylor on Aug. 3, 1982.

Praeger et al reference is an example of the field of art with its disclosure of a miniature ribbon cable 12 having its conductors 14 soldered directly to the contacts 16 that are carried on a connector plate 18. The patent states that the connector plate 18 may be a dielectric circuit board. In the Praeger et al patent, the cable conductor ends are attached and electrically connected to the circuit board contacts by reflow soldering. Both are pretinned and heated with infrared energy.

The Taylor reference shows a method of terminating and connecting flat ribbon cables. A reflow soldering technique is taught in the Mulcahy patent.

Micro-surface welding is disclosed by the Funari reference wherein a pair of electrically conducting bonding tip members which are spaced from each other, are utilized to achieve the connection. Electrical interconnection using welding techniques is also taught by Nicolas et al reference.

The Zaleckas patent discloses the technique of bonding beam leads to the conductive gold pattern 15 on a dielectric substrate 12. The pattern may connect to one or more integrated circuit chips 16. However, none of the cited patent references show a ribbon cable to chip stack direct bonding system that utilized epoxy for additional support and strength. The present invention is intended to satisfy that need.

SUMMARY OF THE INVENTION

The present invention utilizes a direct cable attachment method for connecting a flat ribbon cable to a stack of silicon integrated circuit chips. A stacked silicon array module has its back plane physically and electrically mated to a mounting block. The mounting is in turn bonded to a silicon wiring board that carries either copper or gold leads. A first method of connection involves a reflow solder technique in which both the ribbon cable and the wiring board leads are pretinned with solder. Epoxy is added to give the assembly the required strength. In a second method each cable conductor is individually welded to the respective wiring board lead by using a welding unit with a split tip. This step is followed by the application of epoxy to the cable lead connection for additional support.

It is one object of the present invention, therefore, to provide an improved method of directly attaching a flat ribbon cable to a stack of integrated circuit units.

It is another object of the invention to provide an improved direct cable attachment method wherein the ribbon cable leads and the wiring board leads are pretinned with solder, then the leads are aligned with each other, and heat is applied to reflow the solder.

It is another object of the invention to provide an improved direct cable attachment method wherein epoxy is applied to the cable lead connections to provide additional strength.

It is another object of the invention to provide an improved direct cable attachment method wherein the ribbon cable leads and the wiring board leads are precisely aligned and then fastened together by a welding unit with a split tip.

It is another object of the invention to provide an improved direct cable attachment method wherein the corresponding leads of the ribbon cable and the wiring board are aligned and then attached to each by a thermal bonding technique.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
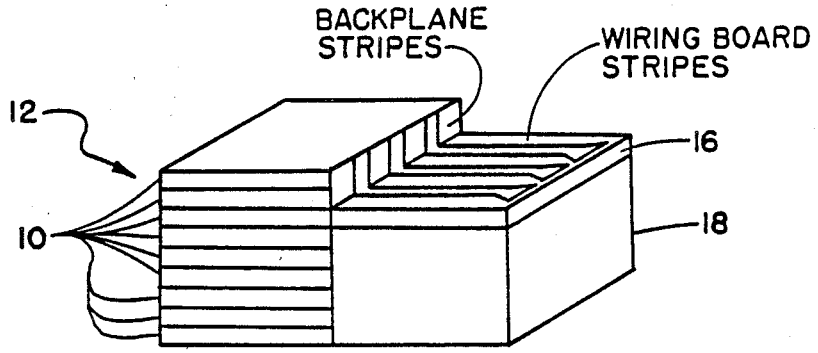
FIG. 1 is a perspective view of a stacked silicon array module attached to a mounting block and a wiring board.

Turning now to FIG. 1, there is shown an electronic apparatus wherein a plurality of silicon array chips 10 are stacked upon another to form a cubic configuration that is an array module 12. A silicon wiring board 16 with copper or gold leads is bonded onto a ceramic mounting block 18. The wiring board 16 is attached to the mounting block 18 to form a composite unit, which is physically and electrically mated to the back plane of the silicon array module 12.

Figure 2:
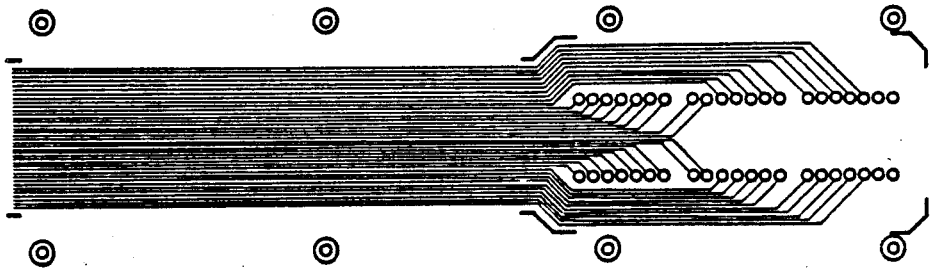
FIG. 2 is a schematic representation of a ribbon cable.

In FIG. 2, there is shown a schematic illustration of a typical ribbon cable. The ribbon cable is connected to the wiring board to provide external access to the circuits in the stacked silicon array module, i.e. the balance of an electronics system in which the array module is utilized.

The present invention provides two methods of attaching the ribbon cable to the wiring board. The first method is a reflow solder method which is shown in FIG. 3, and the second method is a thermal bonding method which is shown in FIG. 4.

Figure 3:
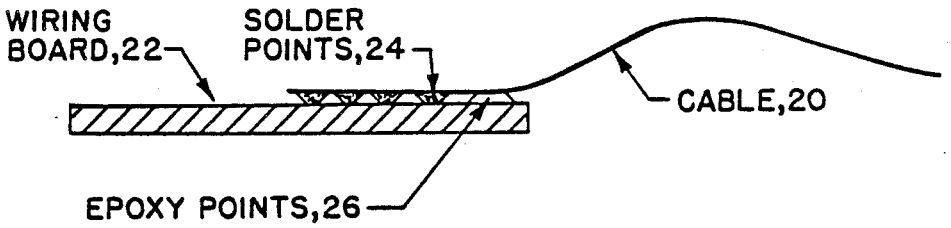
FIG. 3 is a schematic illustration of a ribbon cable attached to a wiring board by the reflow solder method, and, FIG. 4 is a schematic illustration of a ribbon cable attached to a wiring board by the thermally bonded method.
Figure 4:
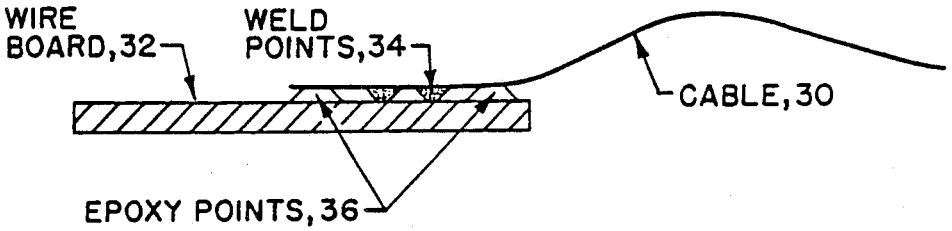

In FIG. 3 there is shown a schematic illustration of a ribbon cable 20 that is attached to a wiring board 22 by the solder reflow method. The solder reflow method requires that the following steps be utilized:

1. the leads of the ribbon cable 20 are pre-tinned with solder,
2. the leads of the wiring board 22 are pre-tinned with solder,
3. the leads of the ribbon cable 20 are aligned with the leads of the wiring board 22,
4. the leads of the ribbon cable 20 and the wiring board 22 are securely fastened to each other to maintain their relative alignment,
5. the ribbon cable/wiring board assembly is placed in a heating unit, such as an oven,
6. the heating unit provides a temperature of 200° C. reflow the solder,
7. epoxying each corresponding lead of the ribbon cable 20 and the wiring board 22 to provide additional structural stability and strength to the assembly.

It may be noted in FIG. 3 that the solder points 24 are shown as points between the leads of the ribbon cable 20 and the wiring board 22, however, this solder area may well be represented by a completely solid area that may or may not have voids therein. The position of the epoxy points 26 was specifically chosen to provide additional strength to the cable/wiring board connection interface and thereby provide additional stability as well.

In FIG. 4 there is shown a schematic illustration of a ribbon cable 30 that is attached to a wiring board 32 by the thermal bonding method. The thermal bonding method requires that the following steps be utilized:

1. each lead of the ribbon cable 30 is precisely positioned over and on the corresponding lead of the wiring board 32, (Note: an alignment and clamping fixture may be utilized to provide the precise alignment of the ribbon cable 30 to the wiring board 34 as well as clamping of the ribbon cable in place during the welding operation.)
2. each lead of the ribbon cable 30 is then individually welded to the respective lead of the wiring board 32 by using either a standard or a split tip welder unit,
3. an epoxy point is applied to each ribbon cable/wiring board lead to provide additional structural stability and strength to the assembly.

It may be noted in FIG. 4 that the weld points 34 are shown as points between the leads of the ribbon cable 30 and the wiring board 32, however, this weld area may well be represented by a completely solid area that may or may not have voids therein. The position of the epoxy points 36 was specifically chosen to provide additional strength to the cable/wiring board connection interface and thereby provide additional stability as well.

Tests conducted indicated that either method is suitable for cable attachment. One hundred percent continuity with minimal resistance was easily attained in all experimentation. However, the solder reflow method has a potential problem that is related to the exercise of the method rather than the method itself. It is critical that the amount of solder which is applied to the leads during the tinning operation be carefully controlled. An excessive amount of solder will tend to flow beyond the conductor leads thereby causing shorts between adjacent leads. This can be prevented by careful control of the amount of solder that is applied to the leads of athe ribbon cable and wiring board, as well as by precise control of the temperature that is used to reflow the solder.

Although the invention has been described with reference to a particular embodiment, it will be understood to those skilled in the art that the invention is capable of a variety of alternative embodiments within the spirit and scope of the appended claims.

What is claimed is:

1. A method of directly attaching a ribbon cable to a stack of semiconductor modules comprising the steps of:
   a. pre-tinning the leads of the ribbon cable with solder,
   b. pre-tinning the leads of a wiring board with solder,
   c. preselectively aligning the leads of said ribbon cable, respectively, with the leads of said wiring board,
   d. securing each of the leads of said ribbon cable and each of the leads of said wiring board to each other, respectively, so as to maintain said preselected alignment and to form a ribbon cable/wiring board assembly,
   e. placing the ribbon cable/wiring board assembly in a heating means,
   f. applying a predetermined amount of heat to reflow the solder in order to provide an interconnection between said ribbon cable and said wiring board, and
   g. applying epoxy to each of said leads of said ribbon cable/wiring board assembly to provide additional stability and strength to said interconnection.

2. A method of directly attaching a ribbon cable to a stack of semiconductor modules comprising the steps of:
   a. preselectively aligning each lead of the ribbon cable precisely with a corresponding lead of a wiring board,
   b. securing each of the leads of said ribbon cable and each of the leads of said wiring board to each other, respectively, so as to maintain said preselected alignment and to form a ribbon cable/wiring board assembly,
   c. welding each lead of said ribbon cable to its corresponding lead on said wiring board by using a welding means with a predetermined tip shape, and
   d. applying epoxy to each of said leads of said ribbon cable/wiring board assembly to provide additional stability and strength to said interconnection.

3. The method as described in claim 1 wherein said heating means comprises an oven.

4. The method as described in claim 1 wherein said predetermined amount of heat equals 200° C.

5. The method as described in claim 2 wherein said predetermined tip shape comprises a single point.

6. The method as described in claim 2 wherein said predetermined tip shape comprises a split tip.

* * * * *